(12) United States Patent
Takaishi

(10) Patent No.: US 8,299,524 B2
(45) Date of Patent: Oct. 30, 2012

(54) SEMICONDUCTOR DEVICE WITH VOLTAGE SUSTAINING REGION FORMED ALONG A TRENCH

(75) Inventor: Masaru Takaishi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 11/195,869

(22) Filed: Aug. 3, 2005

(65) Prior Publication Data

US 2006/0027861 A1   Feb. 9, 2006

(30) Foreign Application Priority Data

Aug. 4, 2004   (JP) .................................. 2004-228500
Jul. 28, 2005   (JP) .................................. 2005-218470

(51) Int. Cl.
*H01L 29/78* (2006.01)
(52) U.S. Cl. ................. 257/333; 257/397; 257/E29.257; 257/E29.262
(58) Field of Classification Search .......... 257/327–330, 257/333, E21.418, E29.257, 397, E29.262
See application file for complete search history.

(56) References Cited

U.S. PATENT DOCUMENTS

| | | | | |
|---|---|---|---|---|
| 5,801,417 A * | 9/1998 | Tsang et al. | ................... | 257/333 |
| 5,981,996 A | 11/1999 | Fujishima | | |
| 6,307,246 B1 * | 10/2001 | Nitta et al. | ..................... | 257/493 |
| 6,433,385 B1 * | 8/2002 | Kocon et al. | ................... | 257/328 |
| 6,700,175 B1 * | 3/2004 | Kodama et al. | ................ | 257/489 |
| 6,706,615 B2 * | 3/2004 | Kitada et al. | .................. | 438/430 |
| 2002/0030237 A1 * | 3/2002 | Omura et al. | ................. | 257/397 |
| 2002/0070418 A1 | 6/2002 | Kinzer et al. | | |
| 2002/0175368 A1 | 11/2002 | Izumisawa et al. | | |
| 2004/0031987 A1 * | 2/2004 | Henninger et al. | .......... | 257/328 |
| 2005/0173758 A1 | 8/2005 | Peake et al. | | |
| 2005/0208722 A1 | 9/2005 | Peake et al. | | |

FOREIGN PATENT DOCUMENTS

| | | | |
|---|---|---|---|
| JP | 08-222735 | * | 8/1996 |
| JP | 2001-111050 A | | 4/2001 |
| JP | 2001-210823 A | | 8/2001 |
| JP | 2001-244461 | | 9/2001 |
| JP | 2002-217415 | | 8/2002 |
| JP | 2002-531953 | | 9/2002 |
| JP | 2003-46082 | | 2/2003 |
| JP | 2005-528796 A | | 9/2005 |

OTHER PUBLICATIONS

S. Wolf et al., Silicon Processing for the VLSI Era, Lattice Press, vol. 1, Process Technology, pp. 200-201.*

* cited by examiner

*Primary Examiner* — Anh Mai
(74) *Attorney, Agent, or Firm* — Rabin & Berdo, P.C.

(57) ABSTRACT

A semiconductor device including a drain region of a first conductivity type formed on a semiconductor substrate; an element forming region that is provided on the drain region and that has a concave portion reaching the drain region; a gate electrode disposed in the concave portion; a superjunction structure portion that is disposed in the element forming region and that is formed by alternately arranging a drift layer of the first conductivity type penetrated by the concave portion and a resurf layer of a second conductivity type being in contact with the drift layer on the semiconductor substrate; and a base region of the second conductivity type that is disposed on the superjunction structure portion so as to be in contact with the drift layer in the element forming region, that is penetrated by the concave portion, and that faces the gate electrode with the gate insulating film therebetween.

3 Claims, 7 Drawing Sheets

US 8,299,524 B2

SEMICONDUCTOR DEVICE WITH VOLTAGE SUSTAINING REGION FORMED ALONG A TRENCH

BACKGROUND OF THE INVENTION

1. Field of the Invention

This invention relates to a semiconductor device that has a so-called superjunction structure and a method for manufacturing the semiconductor device.

2. Description of Related Art

An attempt has been carried out to enhance the withstand voltage of semiconductor devices provided with MOSFETs (Metal Oxide Semiconductor Field Effect Transistors).

FIG. 4 is a diagrammatic sectional view of a conventional semiconductor device provided with MOSFETs.

A semiconductor layer 54 including an N-type drift layer (N-type pillar layer) 52 and a P-type resurf layer (P-type pillar layer) 53 is formed on an $N^{++}$-type semiconductor substrate 51. The drift layer 52 and the resurf layer 53 are alternately arranged in a direction parallel to the semiconductor substrate 51, thus forming a so-called superjunction structure.

A plurality of trenches 55 are formed. Each of the trenches 55 has a depth so as to penetrate through the semiconductor layer 54 in its thickness direction, and reach an interface between the semiconductor substrate 51 and the semiconductor layer 54. The trenches 55 each have their inner side walls almost perpendicular to the semiconductor substrate 51, and are almost evenly spaced in parallel with each other. The inner side wall of the trench 55 is covered with an oxide film 63, and the inside thereof is filled with a buried layer 64 made of polysilicon or dielectric material.

The drift layer 52 is disposed along the trench 55. The resurf layer 53 is disposed between a pair of drift layers 52 that are respectively disposed along the inner side walls of two adjoining trenches 55.

An N-type region 56 is formed on the drift layer 52. A P-type base region 57 is formed on the resurf layer 53 in such a way as to come into contact with the N-type region 56. An N-type source region 58 is formed on the surface part of the base region 57.

A gate electrode 60 is disposed so as to face the base region 57 placed between the N-type region 56 and the source region 58 and so as to face the vicinity thereof, with an insulating film 59 therebetween. A source electrode 61 is electrically connected to the source region 58 and the base region 57. A drain electrode 62 is formed on a rear surface of the semiconductor substrate 51 (i.e., on a surface opposite to the surface on which the gate electrode 60 and the source electrode 61 are formed).

This semiconductor device is used in a state in which one of the source electrode 61 and the drain electrode 62 is connected to an external load and in a state in which a fixed voltage is applied between the external load and the other one of the source electrode 61 and the drain electrode 62 by means of a power source. The voltage applied therebetween gives a reverse bias to a PN junction formed between the resurf layer 53 and the drift layer 52.

In the base region 57 between the N-type region 56 and the source region 58, a channel is formed near the interface between the base region 57 and the insulating film 59 by setting the gate electrode 60 at a suitable electric potential in this state. Further, reverse bias divided by the external load and by the on-resistance of the MOSFET is applied onto the PN junction formed between the resurf layer 53 and the drift layer 52. However, a depletion layer generated by this is only slightly spread, and a path for carriers (electrons) is left in the drift layer 52.

As a result, an electric current flows from the drain electrode 62 to the source electrode 61 through the semiconductor substrate 51, the drift layer 52, the N-type region 56, the vicinity (channel) of the interface between the base region 57 and the insulating film 59, and the source region 58. This semiconductor device has a so-called planar-type structure, and an electric current flows in a direction parallel to the semiconductor substrate 51 near the channel.

Next, a description will be given of a situation in which the MOSFET is in an OFF-state, i.e., a situation in which the gate electrode 60 is not set at the suitable electric potential mentioned above and no channel is formed. Since an electric current does not flow to the MOSFET in this situation, the power-supply voltage is directly applied onto the PN junction formed between the drift layer 52 and the resurf layer 53 as reverse bias. Therefore, a depletion layer is swiftly spread from the interface S between the drift layer 52 and the resurf layer 53 to the drift layer 52 and the resurf layer 53, so that the drift layer 52 and the resurf layer 53 are completely depleted. Hence, the on-resistance can be reduced by doping the drift layer 52 with impurities at a high concentration, and excellent withstand voltage characteristics (e.g., 200V) can be additionally obtained.

In a process for manufacturing the semiconductor device, the drift layer 52 is formed by injecting impurities to the inner wall surface of the trench 55. The trench 55 has been used only to form the drift layer 52, and has not been effectively used.

The thus structured semiconductor device is disclosed by Japanese Published Unexamined Patent Application No. 2003-46082.

However, the planar-type semiconductor device has difficulty in miniaturizing elements, and, for this reason, regions where channels are formed cannot be enlarged for each unit area. Therefore, in practice, the on-resistance cannot be much lowered.

SUMMARY OF THE INVENTION

It is therefore an object of the present invention to provide a semiconductor device in which elements can be miniaturized and in which the on-resistance can be reduced, and provide a method for manufacturing the semiconductor device.

The semiconductor device of the present invention includes a drain region of a first conductivity type formed on a semiconductor substrate; an element forming region that is provided on the drain region and that has a concave portion reaching the drain region; a gate electrode disposed in the concave portion; a gate insulating film provided between the gate electrode and an inner wall surface of the concave portion; a superjunction structure portion that is disposed in the element forming region and that is formed by alternately arranging a drift layer of the first conductivity type through which the concave portion penetrates and a resurf layer of a second conductivity type that is different from the first conductivity type, the resurf layer being in contact with the drift layer, on the semiconductor substrate; a base region of the second conductivity type that is disposed on the superjunction structure portion so as to be in contact with the drift layer in the element forming region, that is penetrated by the concave portion, and that faces the gate electrode with the gate insulating film therebetween; and a source region that is formed on the base region in the element forming region and that is penetrated by the concave portion.

According to this invention, the gate electrode is disposed inside the concave portion. When a predetermined voltage is applied between the drain region (drift layer) and the source region, so that the gate electrode reaches a predetermined electric potential, a channel is formed near an interface between the base region and the insulating film in the base region. Accordingly, an electric current flows through a conductive path, i.e., through the semiconductor substrate (drain region), the drift layer, the vicinity (channel) of the interface of the base region with the insulating film, and the source region in this order. Near the channel, the electric current flows in a direction in which the drift layer, the base region, and the source region are arranged, i.e., in the depth direction of the concave portion (direction perpendicular to the semiconductor substrate).

In a step of manufacturing this semiconductor device, the drift layer can be formed by introducing first-conductivity-type impurity ions into the inner wall surface of the concave portion. In the thus structured semiconductor device, the gate electrode is disposed at the concave portion serving to form the drift layer (superjunction structure). This makes it possible to miniaturize the element (for example, MOSFET) made up of the drift layer, the base region, the source region, the gate insulating film, and the gate electrode.

Additionally, a region where the channel is formed for each unit area of the semiconductor substrate is increased by miniaturizing this element, and, as a result, the on-resistance can be decreased.

On the other hand, this semiconductor device has a superjunction structure portion formed by the drift layer and the resurf layer. If a large voltage of reverse bias is applied onto the PN junction formed between the drift layer and the resurf layer when the gate electrode is not set at the predetermined electric potential mentioned above, a depletion layer will be swiftly spread from the interface between the drift layer and the resurf layer (hereinafter, referred to simply as "interface") into the drift layer and the resurf layer, and, accordingly, the drift layer and the resurf layer will be completely depleted. Therefore, this semiconductor device can have a high withstand voltage (for example, 80V to 300V). In other words, the withstand voltage can be enhanced by completely depleting the drift layer while increasing the concentration of impurities of the drift layer thereby decreasing the on-resistance.

The drain region may be a semiconductor substrate itself. The gate electrode can be made of polysilicon that has been made electrically conductive (resistant in a low level), for example, by introducing impurities. Alternatively, the gate electrode may be made of metal material or may include both polysilicon and metal material.

The inside of the concave portion may be almost completely filled with the gate electrode. In this case, the occurrence of a warp in the semiconductor substrate can be reduced.

The depth of the concave portion to form a superjunction structure is set at, for example, about 40 μm. On the other hand, the base region in which a channel is to be formal is formed in, for example, the surface part of the semiconductor layer (for example, a region having a thickness of about 1 μm from the surface). Since all that is necessary for the gate electrode is to face the base region, the gate electrode is required to be disposed only at the upper part of the inside of the concave portion, and hence there is no need to fill all of the inside of the concave portion with the gate electrode.

The semiconductor device of this invention may further include a filler that is disposed to be nearer to a bottom of the concave portion than the gate electrode inside the concave portion and an insulating film that is greater in thickness than the gate insulating film and that is formed by being stuck onto an area of the inner wall surface deeper than a part where the base region faces the gate electrode in the inner wall surface of the concave portion.

According to this arrangement, since the filler and the gate electrode are disposed inside the concave portion, the occurrence of a warp in the semiconductor substrate can be reduced. Preferably, the inside of the concave portion is almost completely filled with the filler and the gate electrode. In this case, the occurrence of a warp in the semiconductor substrate can be effectively reduced.

The filler may be made of polysilicon, metal material or insulator (for example, silicon oxide), or made of more than one material selected from polysilicon, metal material and insulator. In case the filler is made of polysilicon, the inside of the concave portion can be easily filled with the filler, for example, according to a CVD (Chemical Vapor Deposition) method.

The device can realize a faster operation and lower power consumption by thinning the gate insulating film. On the other hand, the withstand voltage between the inside of the concave portion and the semiconductor substrate (and the drift layer) can be enhanced by thickening the insulating film disposed at the bottom part of the concave portion.

The method for manufacturing a semiconductor device of this invention is a method for manufacturing a semiconductor device having an element forming region that has a superjunction structure portion formed by alternately arranging a drift layer of a first conductivity type and a resurf layer of a second conductivity type different from the first conductivity type on a drain region of the first conductivity type formed on a semiconductor substrate. This method includes the steps of: forming a semiconductor layer of the second conductivity type on the drain region; forming a concave portion that penetrates through the semiconductor layer and reaches the drain region; forming the drift layer along an inner wall surface of the concave portion by introducing impurities of the first conductivity type onto the semiconductor layer exposed to the inner wall surface of the concave portion, so that an area of the semiconductor layer being in contact with the drift layer serves as the resurf layer; forming a base region of the second conductivity type having an exposed part exposed to the inner wall surface of the concave portion on a surface part of the semiconductor layer by injecting impurities of the second conductivity type from a surface of the semiconductor layer; forming a source region of the first conductivity type exposed to the inner wall surface of the concave portion by injecting impurities of the first conductivity type onto a surface part of the base region at an edge of the concave portion; forming an insulating film on the inner wall surface of the concave portion; filling a filler into a bottom part of the concave portion up to a predetermined depth so that the predetermined depth is deeper than the exposed part of the base region in the concave portion where the insulating film is formed; removing the insulating film while allowing the filler to serve as a mask; forming a gate insulating film thinner than the insulating film in an area corresponding to the exposed part of the base region on an exposed surface of the inner wall surface of the concave portion exposed by the removing step; and forming a gate electrode that is to face the exposed part of the base region, with the gate insulating film therebetween, inside the concave portion.

The aforementioned semiconductor device can be produced according to this manufacturing method.

According to this invention, the drift layer is formed by introducing impurities of the first conductivity type to the inner wall surface of the concave portion penetrating through semiconductor layers. The resurf layer is the remaining part of the drift layer (in addition, the base region and the source region) of the semiconductor layers. After the drift layer is formed, the gate electrode is formed inside the concave portion. Thus, according to this manufacturing method, the gate structure can be formed by positively using the concave portion to form the drift layer (the superjunction structure).

The step of forming the semiconductor layer may include a step of forming an epitaxial layer, for example.

The base region and the source region may be formed before the gate insulating film and/or the gate electrode are formed, or, alternatively, may be formed after the gate electrode is formed. In other words, concerning the base region, the exposed part exposed to the inner wall surface of the concave portion is regarded as including a part appearing on the inner wall surface of the concave portion in which the gate insulating film and/or the gate electrode are formed. Likewise, concerning the source region, the appearance on the inner wall surface of the concave portion is regarded as including the appearance on the inner wall surface of the concave portion in which the gate insulating film and/or the gate electrode are formed.

The step of filling the filler may be carried out prior to the step of forming the base region, or may be carried out subsequent to the step of forming the base region. In other words, there is no need to form the base region when the filler is packed.

The gate insulating film and the insulating film (i.e., the insulating film whose film thickness is greater than that of the gate insulating film) are formed individually. The insulating film is covered with the filler when the gate insulating film is formed. Therefore, the formation thickness of the insulating film and the formation thickness of the gate insulating film can be controlled independently of each other. This makes it possible to produce a semiconductor device in which an insulating film is greater in thickness than a gate insulating film.

In the step of forming the insulating film and the gate insulating film, the filler serves as a mask that regulates a region from which the insulating film is removed. Hence, the filler serves to regulate the formation area (the remaining area) of the insulating film, and serves to regulate the formation area of the gate insulating film. Therefore, the insulating film and the gate insulating film can be formed in a predetermined area by forming the filler in an area having a suitable depth inside the concave portion.

The step of forming the insulating film may include a step of forming the insulating film by thermally oxidizing the inner wall surface of the concave portion. The step of forming the gate insulating film may include a step of forming the gate insulating film by thermally oxidizing the inner wall surface of the concave portion. In these cases, the thickness of the insulating film and the thickness of the gate insulating film can be controlled by controlling thermal oxidation conditions such as heating temperature and heating time.

Inside the concave portion, the filler is formed in a bottom part of the concave portion up to a predetermined depth so as to become deeper than the exposed part (the part appearing on the inner wall surface of the concave portion) of the base region with respect to the depth direction of the concave portion. Therefore, subsequent to the step of forming the gate insulating film, an empty space that faces an area corresponding to the base region is formed in the upper part of the concave portion.

The step of forming the gate electrode can include a step of supplying a material used to form the gate electrode to the empty space inside the concave portion, subsequent to the step of forming the gate insulating film. Accordingly, the gate electrode that faces the whole surface of the base region is formed with the gate insulating film therebetween.

The filler can be made of, for example, polysilicon. In this case, the filler can also be excellently (tightly) filled into the concave portion having a large aspect ratio (for example, about 40 μm in depth by about 2 μm in width) according to the CVD method or a like method. Alternatively, the gate electrode may be made of metal material or may include both polysilicon and metal material.

The step of filling the filler may include the steps of supplying the filler to a shallower position than the predetermined depth within the concave portion; and subjecting the filler to etchback up to the predetermined depth, subsequent to the step of supplying the filler.

According to this arrangement, the upper surface (etchback surface) of the filler can be positioned at a predetermined depth by controlling the etchback thickness.

The insulating film may also be formed on the filler when the gate insulating film is formed. In this case, it is possible to obtain a semiconductor device having an insulating film formed between the gate electrode and the filler, in addition to the gate insulating film formed between the gate electrode and the base region.

If the filler is made of polysilicon, the filler can be easily subjected to etchback.

The step of forming the base region may include a step of implanting impurity ions of the second conductivity type into the inner wall surface of the concave portion.

The aforementioned object, other objects, features, and advantageous effects of the present invention will become apparent from the following description of embodiments given with reference to the accompanying drawings.

DESCRIPTION OF THE PREFERRED EMBODIMENTS

Figure 1:
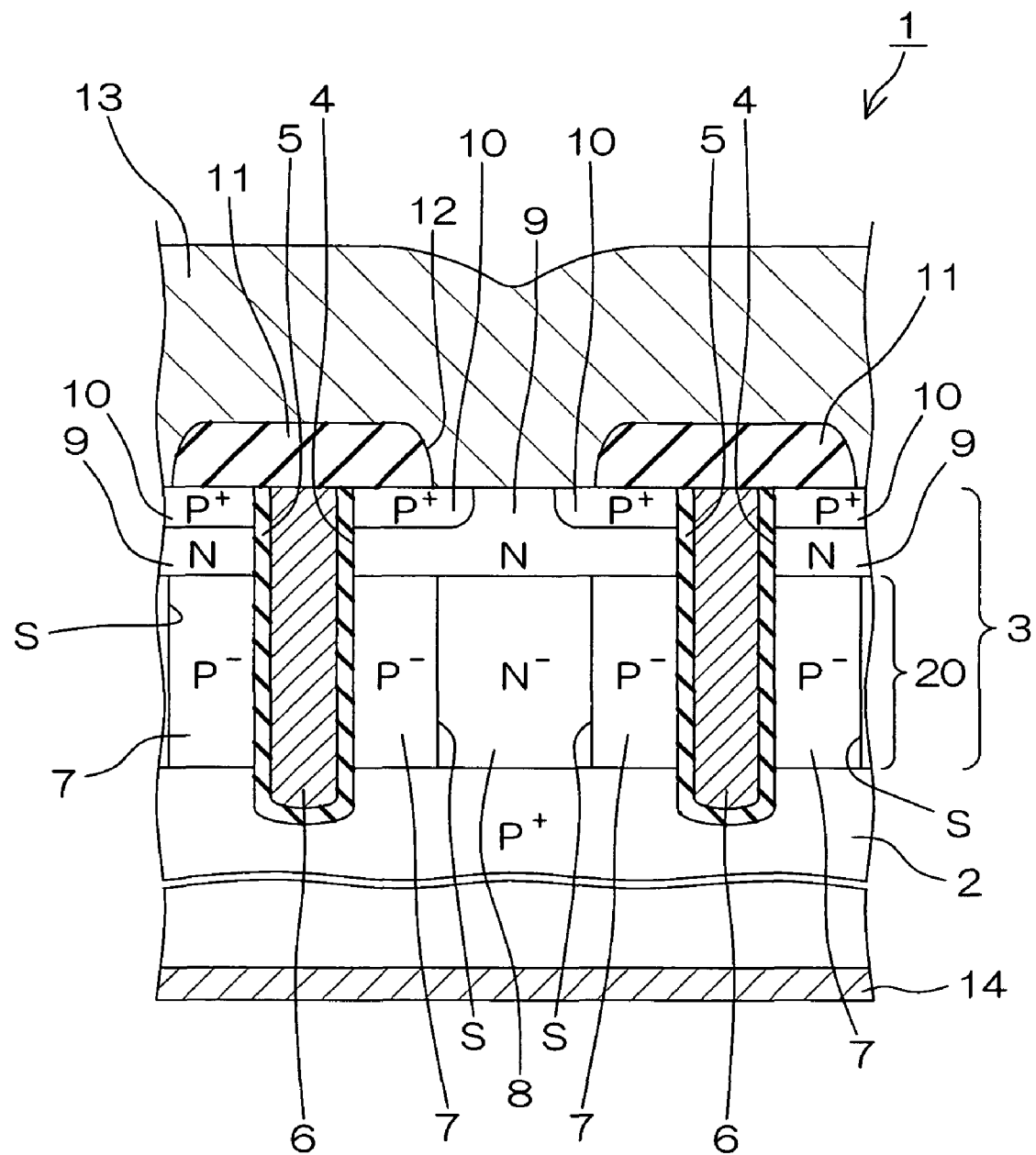
FIG. 1 is a diagrammatic sectional view showing a structure of a semiconductor device according to a first embodiment of the present invention.

FIG. 1 is a diagrammatic sectional view showing a structure of a semiconductor device according to a first embodiment of the present invention. This semiconductor device 1 is a device in which a MOSFET is formed on a silicon substrate 2.

An element forming region 3 in which a MOSFET is formed is provided on the $P^+$-type silicon substrate 2 forming a drain region. A plurality of trenches 4 are formed each of which penetrates through the element forming region 3 and reaches a surface part of the silicon substrate 2. Each trench 4 has an inner side wall almost perpendicular to the silicon substrate 2, and extends in a direction perpendicular to the sheet surface of FIG. 1. In other words, the length direction of the trench 4 is perpendicular to the sheet surface of FIG. 1, and the width direction of the trench 4 is parallel to the sheet surface of FIG. 1 and parallel to the silicon substrate 2.

The width of the trench 4 is, for example, about 2 μm, and the depth of the trench 4 is, for example, about 40 μm. A gap between two adjoining trenches 4 (i.e., width of the element forming region 3 placed between two adjoining trenches 4) is, for example, about 4 μm to 6 μm.

Although only two trenches 4 are shown in FIG. 1, the semiconductor device 1 has much more than two trenches 4. These trenches 4 are spaced almost evenly.

The inner side wall surface of the trench 4 is covered with an insulating film 5 made of silicon oxide ($SiO_2$). The inside of the trench 4 is filled with a gate electrode 6 made of polysilicon that has been made electrically conductive by the introduction of impurities.

On the silicon substrate 2, the element forming region 3 includes a P$^-$-type drift layer 7 and an N$^-$-type resurf layer 8 alternately arranged in such a way as to come into contact with the silicon substrate 2, an N-type base region 9 formed on the drift layer 7 and the resurf layer 8, and a P$^+$-type source region 10 formed on the surface part of the base region 9.

The drift layer 7 is formed along the inner side wall surfaces on both sides in the width direction of the trench 4. The resurf layer 8 is formed between a pair of drift layers 7 that are formed along the inner side wall surfaces, respectively, of two adjoining trenches 4. The formation depth of the drift layer 7 from the surface of the element forming region 3 is almost equal to that of the resurf layer 8 therefrom. The drift layer 7 and the resurf layer 8 constitute a superjunction structure portion 20.

The base region 9 is provided between the two adjoining trenches 4 on the superjunction structure portion 20. The base region 9 faces the gate electrode 6 disposed in each trench 4, with the insulating film 5 therebetween.

The source region 10 is formed at the edge of the trench 4 in the surface part of the base region 9 (the element forming region 3). The source region 10 is not formed in an intermediate part between the two adjoining trenches 4. In an area where the source region 10 is not formed, the base region 9 appears on the surface of the element forming region 3.

The trench 4 is formed to penetrate through the source region 10, the base region 9, and the drift layer 7. The drift layer 7, the base region 9, the source region 10, the gate electrode 6, and the insulating film 5 constitute a MOSFET.

A silicon oxide film 11 is formed on the gate electrode 6 and the element forming region 3. A contact hole 12 is formed to penetrate through the silicon oxide layer 11 in the thickness direction thereof. A part of the base region 9 and a part of the source region 10 are exposed in the contact hole 12.

An electrode (source electrode) 13 made of metal, such as aluminum (Al), is formed on the element forming region 3 and the silicon oxide layer 11. The electrode 13 is formed in such a way as to fill the contact hole 12 therewith, and is electrically connected to the base region 9 and the source region 10. The electrode 13 and the gate electrode 6 are electrically insulated from each other with the silicon oxide layer 11.

An electrode (drain electrode) 14 is formed on a surface of the silicon substrate 2 opposite to the element forming region 3.

This semiconductor device 1 is used in a state in which one of the electrodes 13 and 14 is connected to an external load and in a state in which a fixed voltage (for example, several hundreds of voltage) is applied between the other electrode 13 or 14 and the external load by means of a power source. The voltage applied therebetween gives a reverse bias to a PN junction formed between the drift layer 7 and the resurf layer 8.

An electric current can be passed between the electrode 13 and the electrode 14 by setting the gate electrode 6 at a predetermined electric potential in this state. In the base region 9 between the drift layer 7 and the source region 10, a channel is formed near the interface between the base region 9 and the insulating film 5, and the semiconductor device 1 reaches an ON-state at this time. The insulating film 5 serves as a gate insulating film between the base region 9 and the gate electrode 6, between the drift layer 7 near the base region 9 and the gate electrode 6, and between the source region 10 near the base region 9 and the gate electrode 6.

At this time, reverse bias (for example, 2V) divided by the external load and by the on-resistance of the MOSFET is applied onto the PN junction formed between the drift layer 7 and the resurf layer 8. However, a depletion layer generated by this is only slightly spread, and a path for carriers (electrons) is left in the drift layer 7. In the semiconductor device 1 being in the ON-state, an electric current flows between the electrode 13 and the electrode 14 through a part of the drift layer 7 that has not been depleted.

As a result, an electric current path is formed from the electrode 14 to the electrode 13 through the silicon substrate 2 (drain region), the drift layer 7, the vicinity (channel) of the interface of the base region 9 with the insulating film 5, and the source region 10. Near the channel, an electric current flows in a direction in which the drift layer 7, the base region 9, and the source region 10 are arranged, i.e., in the depth direction of the trench 4 (direction perpendicular to the silicon substrate 2).

Therefore, the semiconductor device 1 can miniaturize the element (MOSFET) with respect to the direction parallel to the silicon substrate 2. Additionally, the miniaturization of the element makes it possible to increase a region where channels are formed for each unit area of the silicon substrate 2, so that the on-resistance can be lowered.

On the other hand, when this semiconductor device 1 is in an OFF-state, i.e., when the gate electrode 6 is not set at the predetermined electric potential mentioned above, and no channel is not formed, an electric current does not flow to the MOSFET. Therefore, the power-supply voltage is directly applied onto the PN junction formed between the drift layer 7 and the resurf layer 8 as reverse bias.

At this time, near the interface S between the drift layer 7 and the resurf layer 8, a depletion layer is swiftly spread from the interface S into the drift layer 7 and into the resurf layer 8, and, as a result, the drift layer 7 and the resurf layer 8 are completely depleted. Therefore, this semiconductor device 1 can have large withstand voltage (for example, 80V to 300V). In other words, the on-resistance can be lowered by increasing the concentration of impurities of the drift layer 7, and, in addition, high withstand voltage characteristics can be realized.

Figure 2:
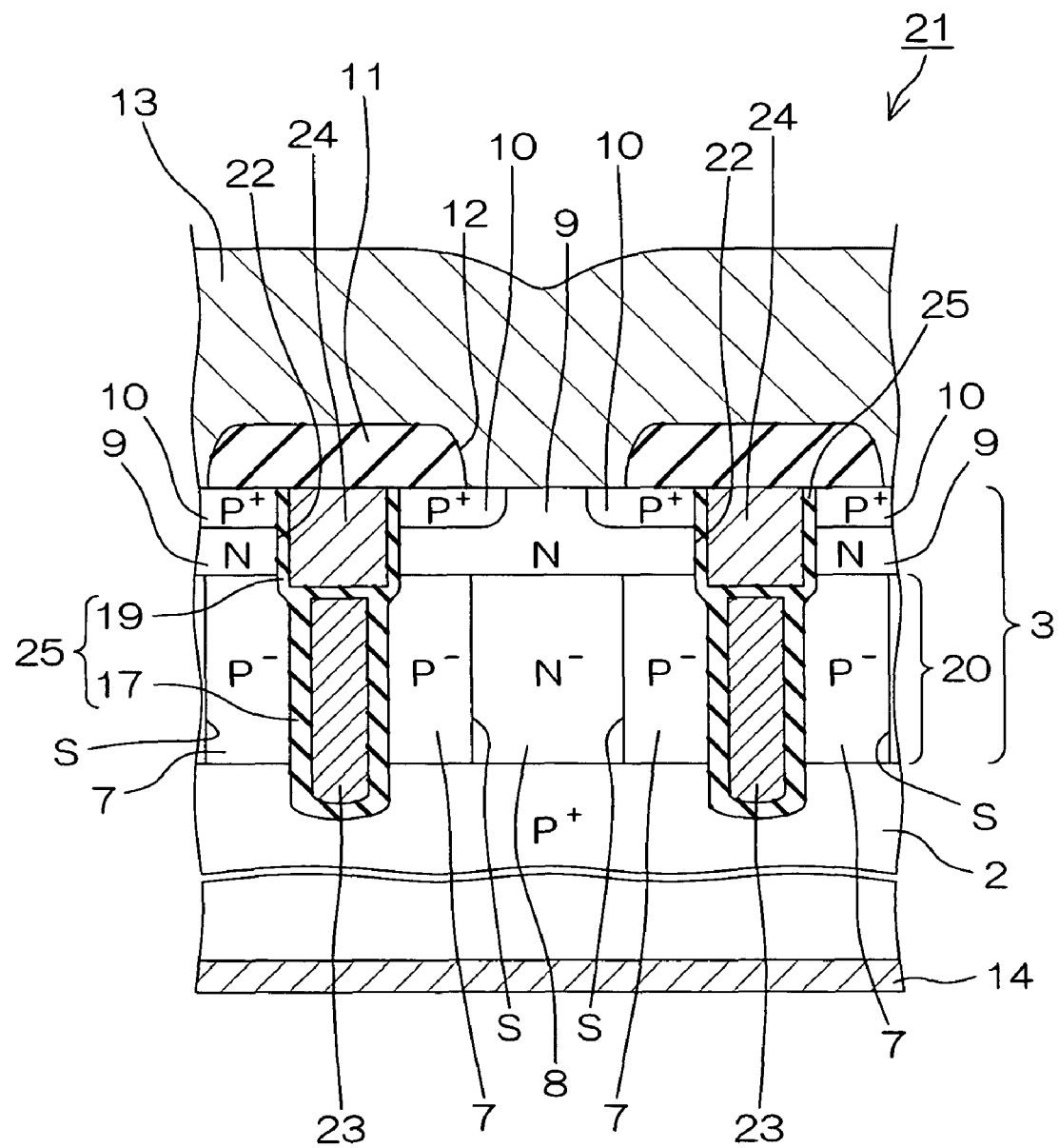
FIG. 2 is a diagrammatic sectional view showing a structure of a semiconductor device according to a second embodiment of the present invention.

FIG. 2 is a diagrammatic sectional view showing a structure of a semiconductor device according to a second embodiment of the present invention. In FIG. 2, the same reference character as in FIG. 1 is given to a component corresponding to each component shown in FIG. 1, and a description thereof is omitted.

This semiconductor device 21 is a device in which a MOSFET is formed on the silicon substrate 2. The semiconductor device 21 is similar in structure to the semiconductor device 1 of FIG. 1. However, a filler 23 made of, for example, polysilicon is disposed on the bottom side of the each trench 22, which corresponds to the trench 4 of the semiconductor device 1, and a gate electrode 24 made of polysilicon that has been made electrically conductive by the introduction of impurities is disposed on the side of the upper part of each trench 22.

The gate electrode 24 is disposed in such a way as to face the source region 10, the base region 9, and the drift layer 7 near the base region 9.

The depth of the trench 22 is, for example, about 40 μm, and the thickness of the base region 9 is, for example, about 1 μm. That is, the base region 9 is formed in an area of the uppermost surface part of the element forming region 3 that has a thickness of about 1 μm. The gate electrode 24 is required to face the base region 9, the drift layer 7 near the base region 9, and the source region 10 near the base region 9. Therefore, as in this semiconductor device 21, a structure can be formed in which the gate electrode 24 is disposed on the side of the upper part of the trench 22, and the filler 23 is disposed in an area deeper than the gate electrode 24 in each trench 22. As shown in FIG. 2, a distance between the filler 23 and a bottom of the trench 22 is shorter than a distance between the gate electrode 24 and the bottom of the trench 22.

A part of the trench 22 in which the gate electrode 24 is disposed is slightly greater in width than a part of the trench 22 in which the filler 23 is disposed.

An insulating film 25 that corresponds to the insulating film 5 of the semiconductor device 1 is formed between the filler 23 and the gate electrode 24 as well as on the inner wall surface of the trench 22. The inside of the trench 22 is almost completely filled with the filler 23, the gate electrode 24, and the insulating film 25. Accordingly, the occurrence of a warp in the silicon substrate 2 can be reduced.

The insulating film 25 includes an oxide film 19 disposed between the gate electrode 24 and the element forming region 3 and between the gate electrode 24 and the filler 23 and an oxide film 17 disposed between the filler 23 and the element forming region 3 and between the filler 23 and the silicon substrate 2.

The oxide film 17 is stuck onto the inner wall surface of the trench 22 nearer its bottom than its part where the base region 9 faces the gate electrode 24. The oxide film 17 is greater in thickness than the oxide film 19. The device can realize a high-speed operation and low power consumption by thinning the insulating film 25 between the gate electrode 24 and the base region 9, between the gate electrode 24 and the drift layer 7 near the base region 9 and between the gate electrode 24 and the source region 10 near the base region 9 (i.e., by thinning a part of the oxide film 19 serving as a gate insulating film) On the other hand, the withstand voltage between the filler 23 and the silicon substrate 2 and between the filler 23 and the drift layer 7 can be increased by thickening the insulating film 25 (the oxide film 17) between the filler 23 and the silicon substrate 2 and between the filer 23 and the drift layer 7.

FIG. 3a to FIG. 3h are diagrammatic sectional views for explaining a method for manufacturing the semiconductor device 21 shown in FIG. 2.

First, an epitaxial layer 15 whose conductivity type is N⁻-type is formed on the silicon substrate 2 whose conductivity type is P⁺-type. A mask 16 that has openings 16a at a position corresponding to the trench 22 of the semiconductor device 1 is formed on the epitaxial layer 15. For example, the mask 16 is made of silicon oxide or silicon nitride.

Thereafter, the epitaxial layer 15 is subjected to dry etching (for example, reactive ion etching) through the openings 16a of the mask 16, thereby forming a plurality of trenches 22 that penetrate the epitaxial layer 15 and that reach the surface part of the silicon substrate 2. The aspect ratio of the trench 22 is high. For example, the width of the trench 22 is about 2 μm whereas the depth of the trench 22 is about 40 μm.

Figure 3A:
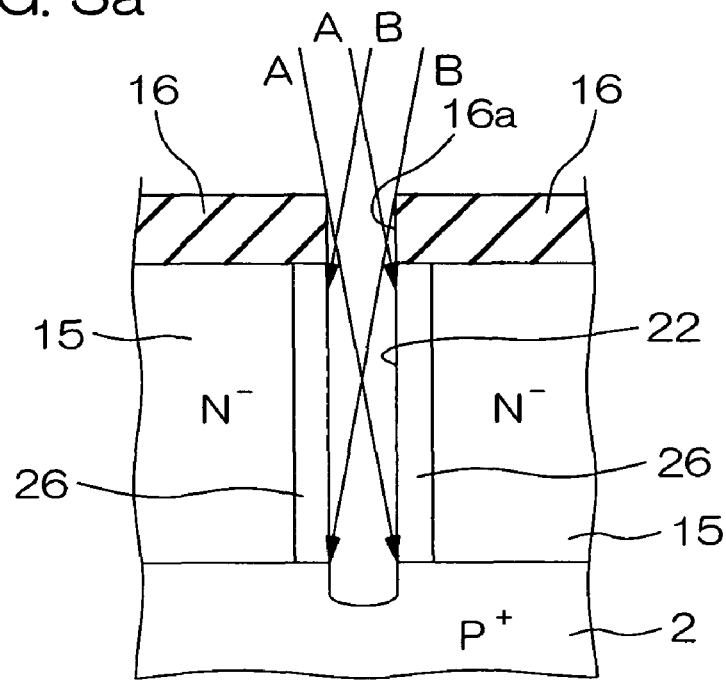
FIG. 3a to FIG. 3h are diagrammatic sectional views for explaining a method for manufacturing the semiconductor device of FIG. 2.

Thereafter, impurity ions for control into the P-type to form the drift layer 7 are implanted (injected) in such a way as to make a predetermined angle with the inner side wall perpendicular to the width direction of the trench 22 (i.e., along the length direction thereof) as shown by arrow "A" in FIG. 3a. With respect to the width direction of the trench 22, P-type impurity ions are implanted to the opposite inner side wall in the same way. The direction in which the P-type impurity ions are implanted at this time is shown by arrow "B" in FIG. 3a.

When P-type impurity ions are implanted to the epitaxial layer 15, the concentration of the impurities of the silicon substrate 2 does not substantially change even if these ions are introduced into the silicon substrate 2, because P-type impurities have already been introduced into the silicon substrate 2 at a high concentration.

Thereafter, the silicon substrate 2 is annealed, and a first injection region 26 into which these impurities have been introduced is formed in the surface part of the epitaxial layer 15 exposed on both sides in the width direction of each trench 22. FIG. 3a shows this state.

Figure 3B:
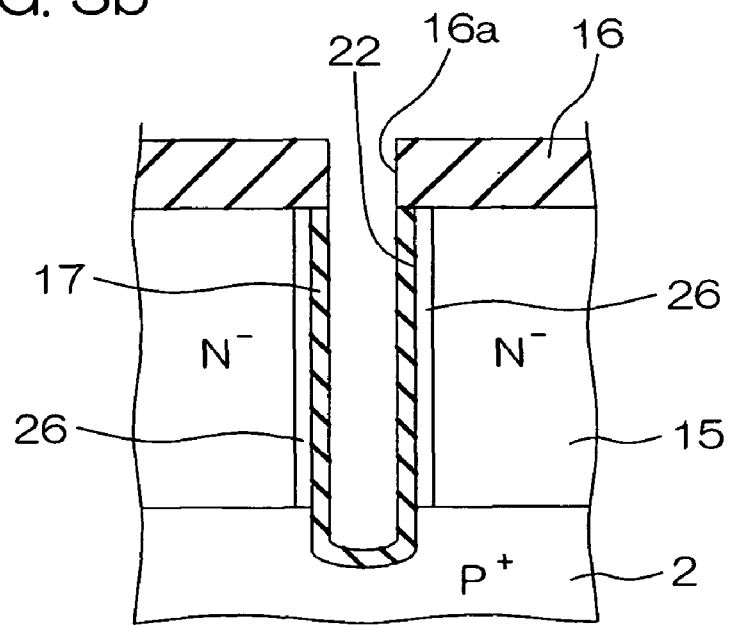

Thereafter, the silicon substrate 2 that has undergone the foregoing steps is heated to a predetermined temperature, and the oxide film 17 is formed on the exposed surface, i.e., on the inner wall surface of each trench 22. At this time, the thickness of the oxide film 17 is controlled so that the first injection region 26 is not completely oxidized. FIG. 3b shows this state.

Figure 3C:
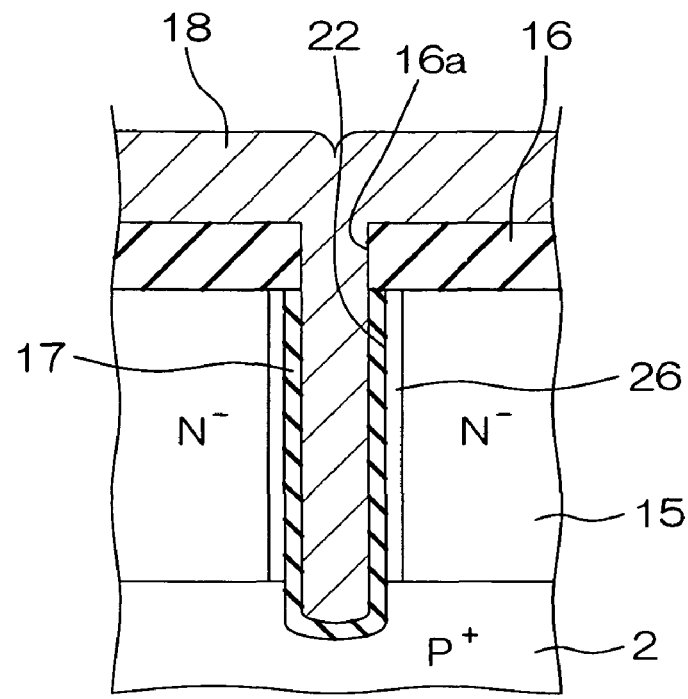

Thereafter, a polysilicon film 18 is formed so as to fill each trench 22 therewith. The polysilicon film 18 is also formed on the epitaxial layer 15. This step can be performed, for example, according to a CVD (Chemical Vapor Deposition) method. In this case, the polysilicon film 18 can be easily embedded in the trench 22 in a dense manner even if the trench 22 has a large aspect ratio as mentioned above. FIG. 3c shows this state. The polysilicon film 18 may be subsequently made electrically conductive by introducing impurities.

Thereafter, the polysilicon film 18 is subjected to etchback, so that the polysilicon film 18 placed outside the trench 22 and the polysilicon film 18 placed at the upper part inside the trench 22 are removed. As a result, a state is reached in which, in each trench 22, the polysilicon film 18 is present only in an area deeper than the formation depth of the base region 9 in the semiconductor device 21 of FIG. 2 with respect to the depth direction of the trench 22. In other words, in this state, the upper surface (etchback surface) of the polysilicon film 18 is positioned at a predetermined depth deeper than a part where the base region 9 faces the gate electrode 24 in the inner wall surface of the trench 22 of the semiconductor device 21 of FIG. 2 inside the trench 22. An empty space is secured on the polysilicon 18 inside the trench 22.

Figure 3D:
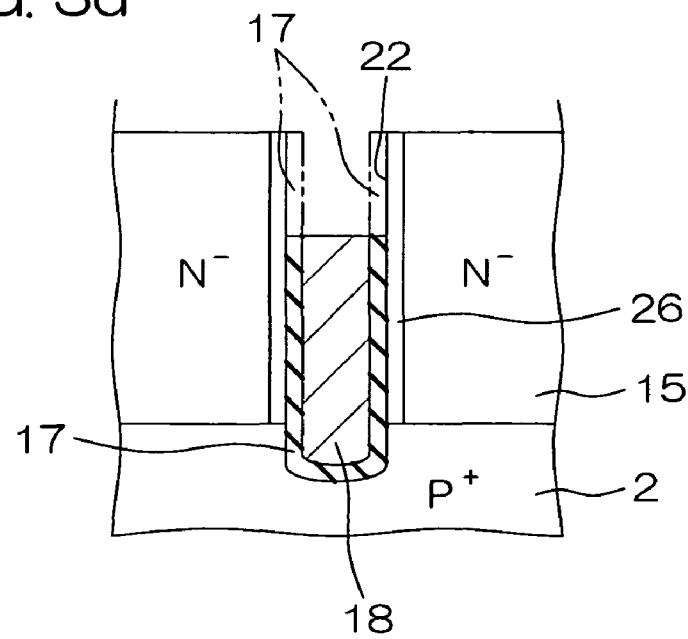

Further, in this state, the oxide film 17 (shown by the alternate long and two short dashes line in FIG. 3d) that is positioned at a shallower depth than the polysilicon 18 (i.e., exposed from the polysilicon 18) and the mask 16 are removed by etching. As a result, the upper part of the trench 22 becomes slightly greater in width than the deeper part of the trench 22. FIG. 3d shows this state.

Figure 3E:
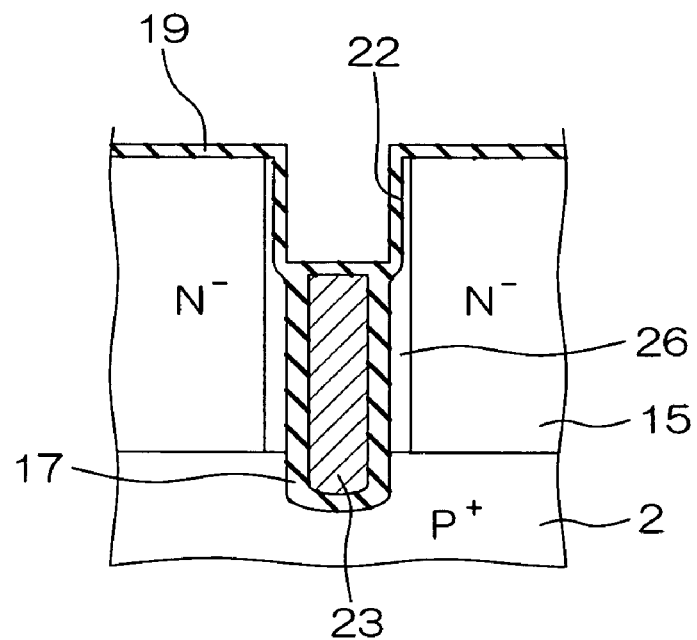

Thereafter, the silicon substrate 2 that has undergone the foregoing steps is heated, whereafter the exposed surface, i.e., the inner side wall of the upper part of each trench 22, the upper surface of the polysilicon film 18, and the surface of the epitaxial layer 15 outside the trench 22 are thermally oxidized, thus forming the oxide film 19. At this time, the oxide film 19 is adjusted to have a predetermined thickness smaller than the oxide film 17 by controlling heating temperature, heating time, etc. The remainder of the polysilicon film 18 is the filler 23. FIG. 3*e* shows this state.

Figure 3F:
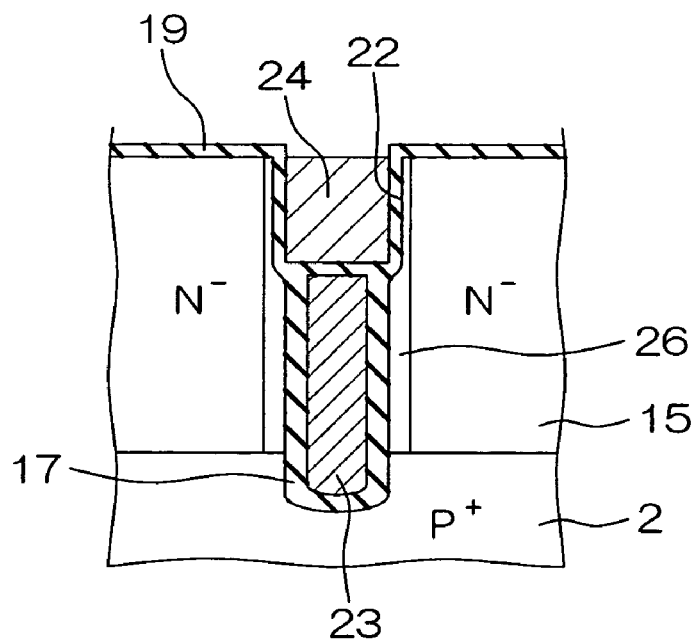

Thereafter, the empty space of the upper part of the trench 22 is filled with polysilicon, and impurities are introduced into this polysilicon, thus forming the electrically conductive gate electrode 24. FIG. 3*f* shows this state.

The process for filling the empty space of the upper part of the trench 22 with polysilicon may include a step in which, for example, a polysilicon film is formed so as to fill the inside of the trench 22 therewith and so as to cover the surface of the epitaxial layer 15 therewith, and then this polysilicon film is subjected to etchback in the same way as the step in which the filler 23 (polysilicon film 18) is formed (see FIG. 3*c* and FIG. 3*d*).

Thereafter, the oxide film 19 exposed on the surface of the epitaxial layer 15 is removed by etching. The remainder of the oxide film 19 and the remainder of the oxide film 17 are turned into the insulating film 25.

Figure 3G:
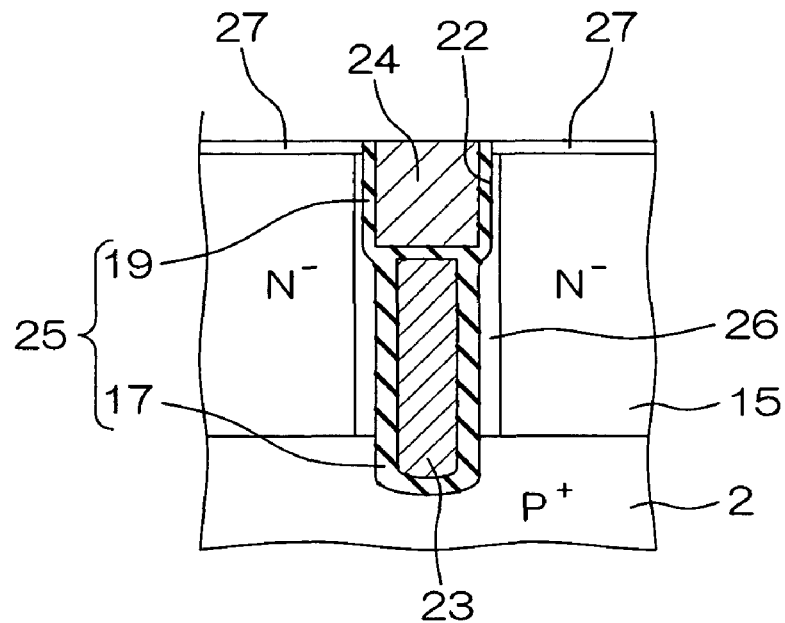

Thereafter, impurities for control into the N-type are injected to the surface of the epitaxial layer 15, so that a second injection region 27 is formed. FIG. 3*g* shows this state.

Figure 3H:
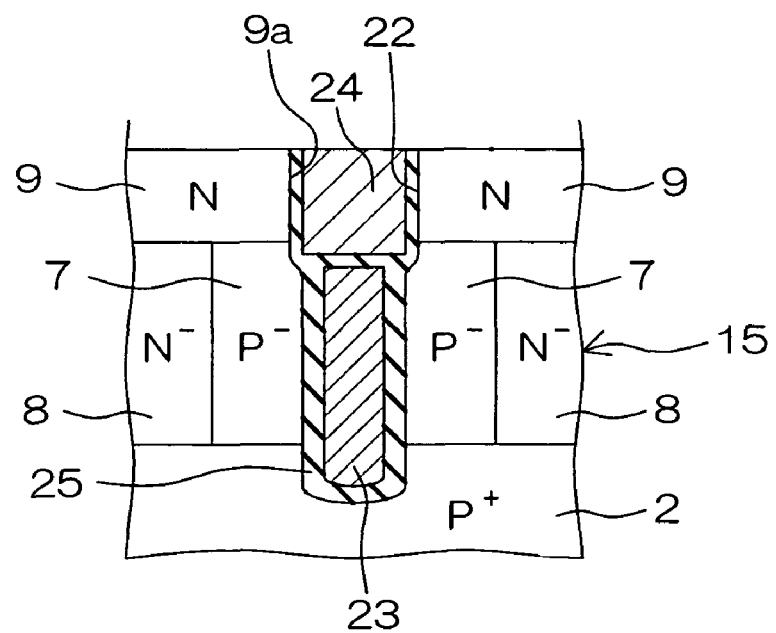
Figure 4:
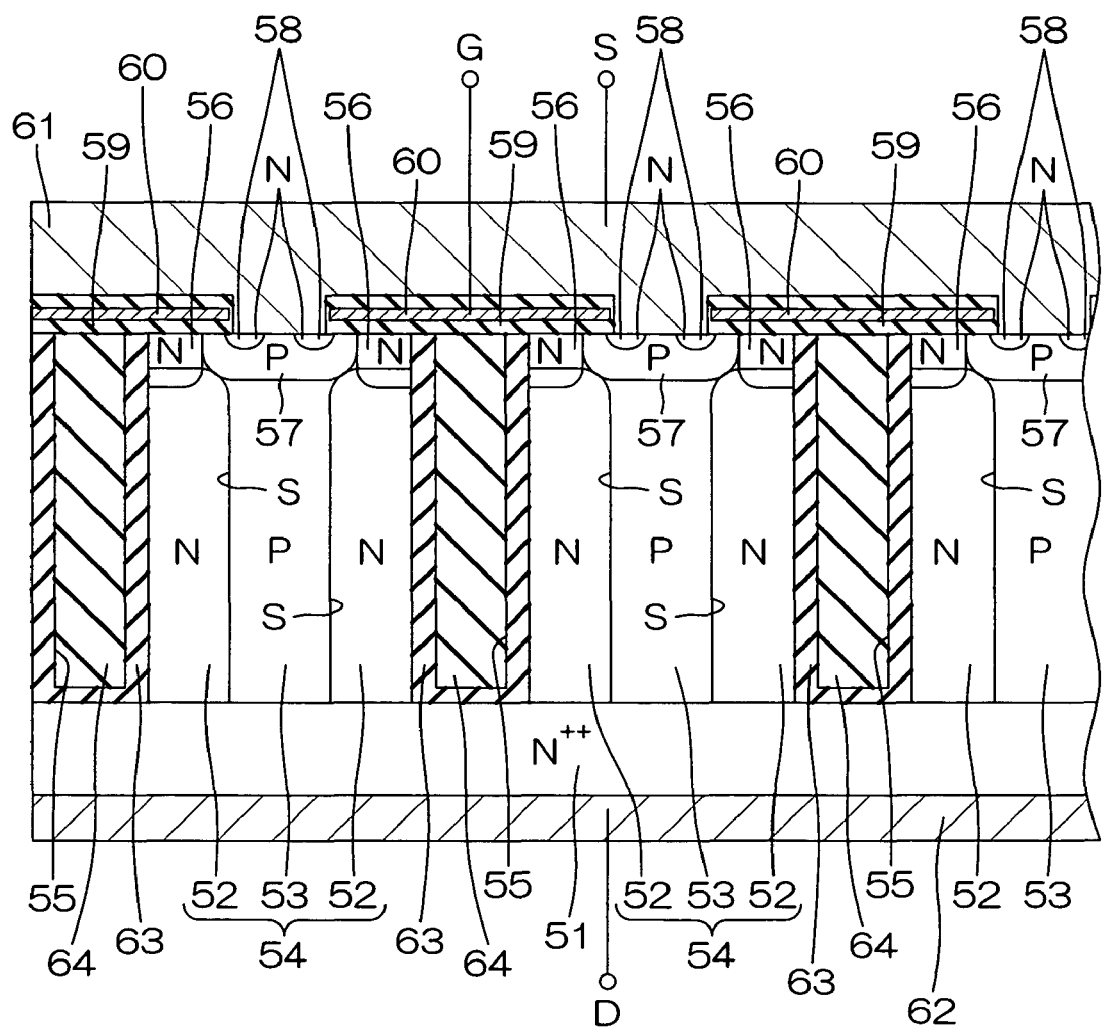
FIG. 4 is a diagrammatic sectional view of a conventional semiconductor device that has a superjunction structure.

Thereafter, the silicon substrate 2 that has undergone the foregoing steps is heated, and then P-type impurities in the first injection region 26 and N-type impurities in the second injection region 27 are diffused into the epitaxial layer 15, thus forming the drift layer 7 and the base region 9. The remaining area of the epitaxial layer 15 (i.e., area being in contact with the drift layer) is turned into the resurf layer 8. The base region 9 includes a part 9*a* exposed to the inner wall surface of the trench 22 (i.e., part appearing on the inner wall surface of the trench 22). FIG. 3*h* shows this state.

At this time, a heating condition is selected so that the boundary between the base region 9 and the drift layer 7 in the inner wall surface of the trench 22 is positioned at a shallower depth than the upper surface of the oxide film 19 on the filler 23 with respect to the depth direction of the trench 22. As a result, the gate electrode 24 faces the whole surface of the part 9*a* exposed from the inner wall surface of the trench 22 of the base region 9.

Thereafter, a resist film (not shown) that has openings corresponding to the source region 10 of the semiconductor device 21 is formed on the base region 9. P-type impurities are then injected to the surface part of the base region 9 through the openings of the resist film. The silicon substrate 2 is further heated, and the P-type impurities injected to the surface part of the base region 9 are diffused into the base region 9, thus forming the source region 10. As a result, the element forming region 3 including the drift layer 7, the resurf layer 8, the base region 9, and the source region 10 is obtained.

Referring to FIG. 2, a silicon oxide film is formed on the whole surface on the side of the element forming region 3 of the silicon substrate 2 that has undergone the foregoing steps. Further, this silicon oxide film is etched through a resist film (not shown) that has a predetermined pattern, whereby the contact hole 12 is formed. The remainder of the silicon oxide layer is used as the silicon oxide film 11.

Thereafter, a predetermined metallic material is supplied to the silicon substrate 2 that has undergone the foregoing steps on the side where the element forming region 3 is formed, and is supplied to the silicon substrate 2 on the opposite side, thus forming the electrodes 13 and 14. As a result, the semiconductor device 21 of FIG. 2 is obtained.

As described above, in this semiconductor device 21, the trench 22 to form the drift layer 7 (superjunction structure) is actively used so as to form a gate structure.

In the aforementioned manufacturing method, the oxide film 17 and the oxide film 19 can be produced under different oxidizing conditions (for example, the heating temperature or heating time of the silicon substrate 2). When the oxide film 19 is formed, the oxide film 17 is covered with the polysilicon film 18. Therefore, the formation thickness of the oxide film 17 and the formation thickness of the oxide film 19 can be controlled independently of each other.

Accordingly, in the insulating film 25, the part (i.e., the oxide film 17) provided between the filler 23 and the silicon substrate 2 and between the filler 23 and the drift layer 7 can be made thicker than the part (i.e., the oxide film 19) provided between the gate electrode 24 and the base region 9 as shown in FIG. 2.

In the step of forming the oxide film 17 and the oxide film 19 (see FIG. 3*d* and FIG. 3*e*), the polysilicon film 18 functions as a mask that restricts a region from which the oxide film 17 is removed, and hence functions to restrict the formation region of the oxide film 17 (i.e., region of the remainder) and to restrict the formation region of the oxide film 19. Therefore, inside the trench 22, the oxide film 17 and the oxide film 19 can be formed in predetermined areas by forming the polysilicon film 18 in a suitable depth area. The formation depth of the polysilicon film 18 inside the trench 22 can be easily controlled by controlling the thickness of etchback.

In the manufacturing method mentioned above, the semiconductor device 1 of FIG. 1 can be obtained by forming the oxide film 5 that has roughly the same thickness as the oxide film 19, instead of forming the oxide film 17 or subsequent to forming and removing the oxide film 17. In this case, the polysilicon film 18 (see FIG. 3*c*) embedded in the trench 22 (4) is made electrically conductive (resistant in a low level) by introducing impurities thereto, and is subjected to etchback so that the polysilicon film 18 becomes almost flush with the surface of the epitaxial layer 15, whereby the gate electrode 6 can be formed.

Although the embodiments of the present invention have been described as above, the present invention can be carried out in other forms. For example, the conductivity type of each semiconductor component of the semiconductor devices 1 and 21 may be opposite in type. In other words, in the aforementioned embodiments, the P-type component may be an N-type, and the N-type component may be a P-type.

In the method for manufacturing the semiconductor device 21 of FIG. 2, it is permissible that, after forming the oxide film 17 (see FIG. 3*b*), the oxide film 17 is completely removed by etching before forming the polysilicon film 18 (see FIG. 3*c*), and the inner wall surface of each trench 4 is thermally oxidized anew so as to form an oxide film that has the same thickness as the oxide film 17.

In the aforementioned embodiments, a description has been given of the semiconductor device in which a MOSFET is formed on the silicon substrate 2. However, the semiconductor device of the present invention may be a semiconductor device in which an IGBT (Insulated Gate Bipolar Transistor) is formed on the silicon substrate 2.

The embodiments of the present invention have been described in detail. However, these embodiments are merely concrete examples used to clarify the technical contents of the present invention. The present invention should not be understood by being limited to the concrete examples. The spirit and scope of the present invention are limited only by the scope of the appended claims.

This application is based on Japanese Patent Application No. 2004-228500 and 2005-218470, respectively filed in Japan Patent Office on Aug. 4, 2004 and Jul. 28, 2005, the entire disclosures of which are hereby incorporated by reference.

What is claimed is:

1. A semiconductor device comprising:

a drain region of a first conductivity type comprised of a semiconductor substrate;

an element forming region provided on the drain region, the element forming region having a concave portion reaching the drain region;

a gate electrode disposed in the concave portion, the gate electrode being made of metal material or being made of both metal material and polysilicon;

a gate insulating film provided between the gate electrode and an inner wall surface of the concave portion;

a superjunction structure portion disposed in the element forming region, the superjunction structure portion being formed by alternately arranging a drift layer of the first conductivity type through which the concave portion penetrates and a resurf layer of a second conductivity type different from the first conductivity type, the resurf layer being in contact with the drift layer, on the semiconductor substrate;

a base region of the second conductivity type disposed on the superjunction structure portion so as to be in contact with the drift layer in the element forming region, the base region being penetrated by the concave portion and facing the gate electrode with the gate insulating film therebetween;

a source region formed on the base region in the element forming region, the source region being penetrated by the concave portion;

a filler disposed inside the concave portion, a distance between the filler and a bottom of the concave portion being shorter than a distance between the gate electrode and the bottom of the concave portion;

a filler insulating film greater in thickness than the gate insulating film, the filler insulating film being formed by being stuck onto an area of the inner wall surface deeper than a part where the base region faces the gate electrode in the inner wall surface of the concave portion, the filler being separated from the element forming region by the filler insulating film; and an insulating film disposed between the gate electrode and the filler, the insulating film having a thickness thinner than that of the filler insulating film in the bottom of the concave portion, wherein:

an upper part of the concave portion in which the gate electrode is disposed is greater in width than a lower part of the concave portion in which the filler is disposed, the upper part of the concave portion reaching the drift layer, the filler is electrically conductive and the gate electrode is electrically conductive, the filler faces the drift layer with the filler insulating film interposed therebetween, a lower end of the filler is positioned at a level within the drain region, and the gate electrode and the filler are disposed in the same concave portion.

2. The semiconductor device of claim 1, wherein the filler is comprised of polysilicon.

3. The semiconductor device of claim 1, wherein an upper surface of the gate electrode and an upper surface of the source region are flush with each other.

* * * * *